United States Patent [19]

Yatsuda

[11] Patent Number: 5,252,882
[45] Date of Patent: Oct. 12, 1993

[54] SURFACE ACOUSTIC WAVE DEVICE AND ITS MANUFACTURING METHOD

[75] Inventor: Hiromi Yatsuda, Mitaka, Japan
[73] Assignee: Japan Radio Co., Ltd., Tokyo, Japan
[21] Appl. No.: 721,823
[22] Filed: Jun. 27, 1991

[30] Foreign Application Priority Data

Jul. 2, 1990 [JP] Japan .................. 2-175015

[51] Int. Cl.$^5$ .............................................. H01L 41/08
[52] U.S. Cl. ............................. 310/313 R; 310/348
[58] Field of Search .............. 310/313 R, 344, 348; 361/400, 403, 413; 439/68-73

[56] References Cited

U.S. PATENT DOCUMENTS

| | | | |
|---|---|---|---|
| 3,634,807 | 1/1972 | Grobe et al. | 439/68 |
| 4,418,299 | 11/1983 | Momosaki | 310/352 |
| 4,447,857 | 5/1984 | Marks et al. | 361/403 |
| 4,734,608 | 3/1988 | Takoshima | 310/313 R |
| 4,736,128 | 4/1988 | Takoshima et al. | 310/313 R |
| 4,737,742 | 4/1988 | Takoshima et al. | 310/313 R |
| 4,795,934 | 1/1989 | Rogerson et al. | 310/313 R |
| 4,864,470 | 9/1989 | Nishio | 361/400 |
| 5,006,792 | 4/1991 | Malhi et al. | 439/68 |
| 5,057,969 | 10/1991 | Ameen et al. | 361/400 |
| 5,121,299 | 6/1992 | Frankeny | 361/413 |

FOREIGN PATENT DOCUMENTS 0132150  5/1989  Japan .................. 361/400

OTHER PUBLICATIONS

IBM Technical Disclosure Bulletin, "Microminiature Module" by M. Bennett, vol. 8, No. 3, Aug. 1965.
"Magnetically Secured Integrated Circuit Package" by D. Landwer Western Electric, Technical Digest No. 28, Oct. 1972.
"Joining Integrated Circuit Chips to Microcast Fingers" by K. Clark et al., IBM Technical Disclosure Bulletin, vo.1 12, No. 11, Apr. 1970.
"Electrical Contacts for Semiconductor Chips" by J. Chu et al. IBM Technical Disclosure Bulletin, vol. 10 No. 1, Jun. 1967.

Primary Examiner—Mark O. Budd
Assistant Examiner—Thomas M. Dougherty
Attorney, Agent, or Firm—Koda and Androlia

[57] ABSTRACT

A surface acoustic wave device and its manufacturing method. A surface acoustic wave device is used as filters for VHF and UHF range signals, or resonators for VHF and UHF range, by driving the surface of a surface acoustic wave element with applied signal to electrodes, transmitting a surface acoustic wave, and receiving the surface acoustic wave with other electrodes. In a configuration of a surface mount type surface acoustic wave device where a surface acoustic wave element is stored inside a package consisting of a base and a cover, pads are attached on a surface of the base and the surface acoustic wave element is fixed to the base by face down bonding.

16 Claims, 6 Drawing Sheets

SURFACE ACOUSTIC WAVE DEVICE AND ITS MANUFACTURING METHOD

BACKGROUND OF THE INVENTION

1. Field of the Invention

This invention relates to a surface acoustic wave device (SAW device, hereafter), particularly to an improvement of an electrode connecting structure from surface acoustic wave elements (SAW elements, hereafter). This invention also relates to a manufacturing method of a SAW device.

2. Description of the Related Art

Conventionally, SAW devices such as SAW filters are utilized in radio devices of VHF or UHF frequency ranges. For example, SAW filters of 800 to 900 MHz are utilized in high frequency circuits of mobile telephone, mobile radio, MCA and the like.

Figure 8:
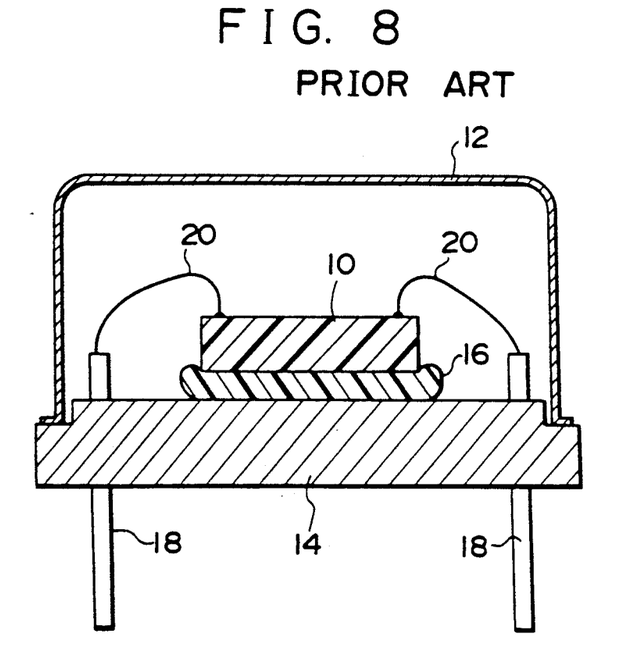
FIG. 8 is a cross-sectional view that shows the first example of a configuration of a conventional SAW device.

FIG. 8 shows an example configuration of a SAW device in a cross-sectional view.

In this conventional embodiment, a SAW element 10 is contained in a package consisting of a cap 12 and a base 14.

The SAW element 10, having an input electrode, an output electrode and an earth electrode, and being formed by a material with surface acousticity, is fixed to the metal base 14 by adhesive 16. The base 14 is sealed with the cap 12.

This conventional embodiment belongs to a lead type device. Edges of a fixed number of metal lead pins run through the base 14 and the lead pins 18, 18 are connected to an electrode of the SAW element 10 through gold or copper wires 20, 20 inside the package. Here, the base 14 and the lead pins 18, 18 are electrically insulated, and the base 14 is not electrically connected with the lead pins 18, 18 or the electrodes of the SAW element 10. The other edges of lead pins 18, 18 is connected to a board having an external circuit (not shown in the figure) using through-hole method or the like.

The wires 20, 20 and the electrodes of the SAW element 10 are connected using wire bonding method, which requires pads (parts with designated area and shape) in the electrode of the SAW element 10, as well as a part that is related to transmission and reception of surface acoustic waves.

Recently, other than conventional lead type SAW devices, SAW devices of surface mount type are manufactured and sold in response to the demand of surface mounting of parts.

Figure 9:
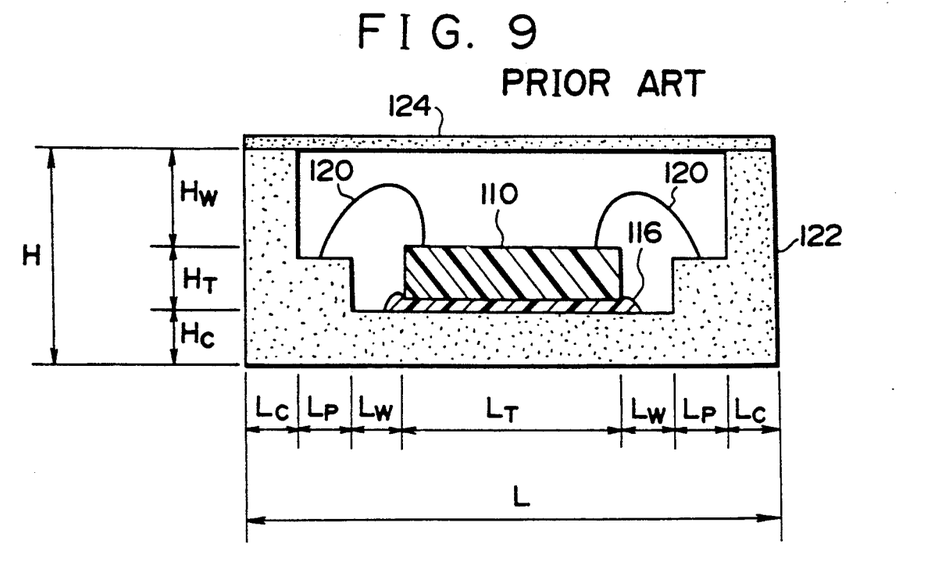
FIG. 9 is a cross-sectional view that shows the second example of a configuration of a conventional SAW device.

FIG. 9 shows a conventional embodiment of a surface mount type SAW device.

In the SAW device of this conventional embodiment, a SAW element 110 is stored in a package consisting of a ceramics base 122 and a cover 124 for surface mounting. In this case, electrodes on the upper surface of the SAW element 110 are connected to pads on the surface of the base 122 through a wire 120. In the figure, 116 indicates adhesive.

Figure 10:
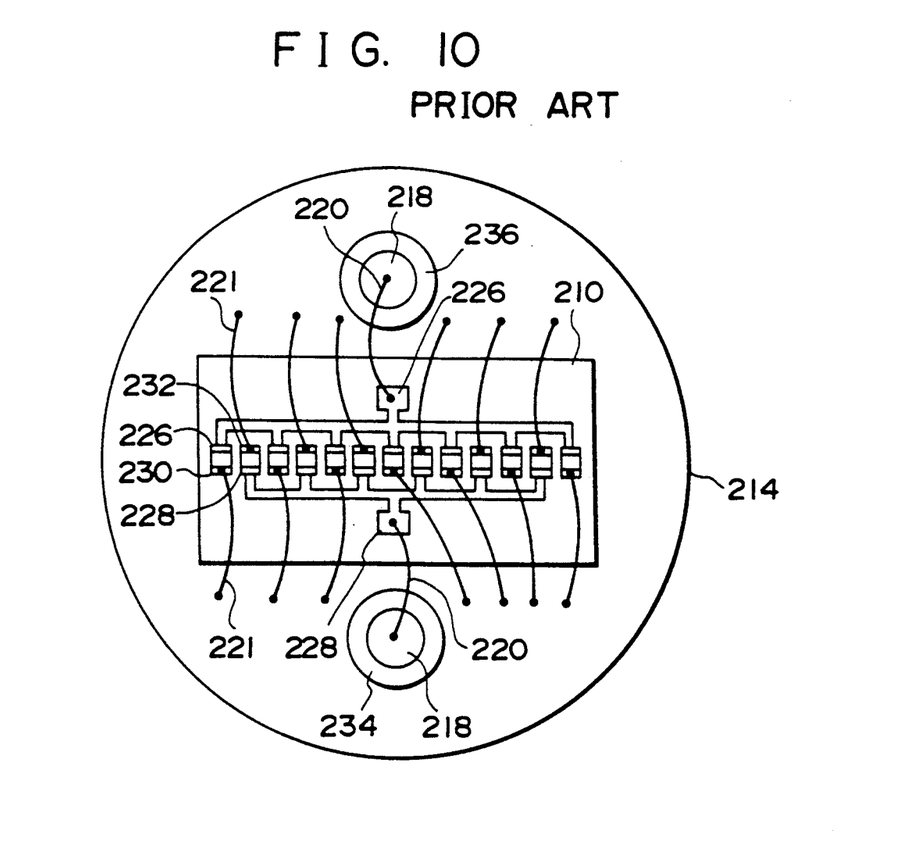
FIG. 10 is a plan view that shows the third example of a configuration of a conventional SAW device.

A SAW device may have more than one input electrode and output electrode. FIG. 10 shows an embodiment of a multiple electrode SAW filter. Multiple electrode SAW filters are widely used for 800–900 MHz range. In the figure, the placement of electrodes on the SAW element is described in detail.

An input electrode 226 and an output electrode 228, both having more than one branch, are adherently attached to the surface of a SAW element 210, which is fixed on a metal base 214 by adhesive (not shown in the figure). The branches are alternately placed on the surface of the SAW element 210.

Earth electrodes 230 and 232, which are formed on the surface of the SAW element 210, are placed at portions near of the branches of the input electrodes 226 and output electrodes 228. Each pair of the input electrode 226 and the earth electrode 230, and the output electrode 228 and the earth electrode 232 constitutes an interdigital electrode. Detail of the interdigital arrangement is not shown in the figure.

The aggregately connected portion of the electrodes 226, 228, 230 and 232, are connected to the edge surface of a lead pin 218 by bonding of a wire 220. The earth electrode 230 and 232 are connected to the base 214 by bonding of a wire 221. The lead pin 218 and the base 214 are electrically insulated by an insulation layer 234.

Figure 11:
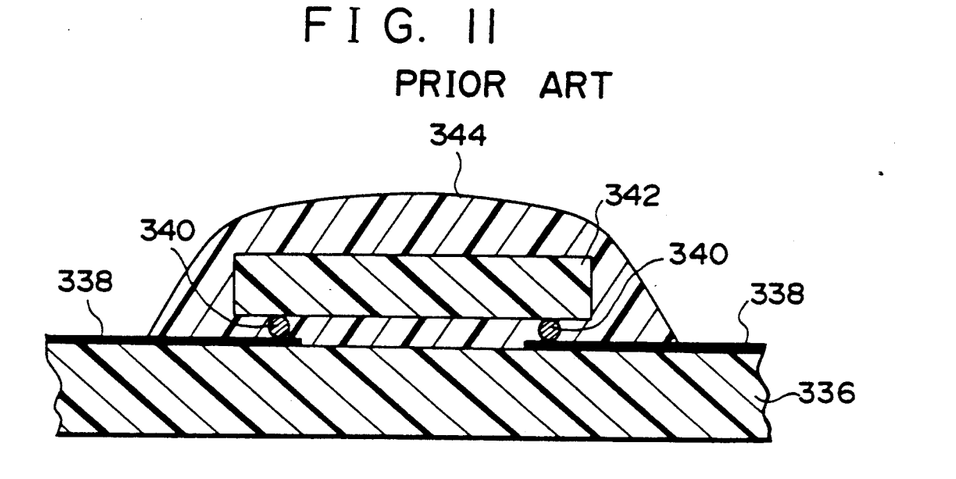
FIG. 11 is a cross-sectional view that shows an embodiment of face down bonding.

As a packaging method of electric parts, including SAW devices, face down bonding with a solder bump shown in FIG. 11 is well known. In this method, electronic parts such as IC's are fixed on boards and covered by resin at the same time. For example, the solder bump (a metal bubble) 340 is attached to the designated position of a drawing electrode (not shown in the figure) which is formed on the surface of an IC substrate 342, and the IC substrate 342 is positioned so that the position of the solder bump 340 agrees with the position of a drawing electrode (not shown in the figure). Then, the drawing electrode of the IC substrate is connected to and fixed with the conductor 338 of the printed circuit substrate 336 through the solder bump 340. This can be done, for example, by pressing the IC substrate downward and adding heat which causes melting of the solder. Afterward, the covering is formed by molding with epoxy resin 344. With this method, the surface mount can be performed promptly.

Conventionally, outside dimension of SAW devices tend to become large. In the devices having a configuration of the first or the second conventional embodiment, some play must be given to the wire for easy implementation of the wire bonding, which limits the size of the package, however small the size of the SAW element. Pads used in wire bonding also need to be large enough.

For example, in FIG. 9, suppose that each part has the following dimension:

$$L_P = L_W = L_C = 0.5 \text{ mm}$$

$$H_W = 1.0 \text{ mm}$$

$$H_C = 0.5 \text{ mm}$$

then, the outside dimension of the package L, H with respect to LT and HT are:

$$L = L_T + 2(L_P + L_W + L_C)$$
$$= L_T + 3 \text{ mm}$$

$$H = H_T + H_W + H_C$$
$$= H_T + 1.5 \text{ mm}$$

where $L_T$ and $H_T$ are the dimensions of the SAW element. Therefore, if a SAW element has a dimension of 1 mm (length)×2 mm (width)×0.5 mm (thickness), which is a typical dimension of widely available SAW filters of 800–900 MHz range, the dimension of the package becomes 4 mm (length)×5 mm (width)×2 mm (thickness).

Wire bonding also increases the cost. This is because the positioning of the bonding requires high accuracy that demands an expensive manufacturing device. Moreover, in multiple electrode type SAW filters, where the number of bonding is larger, the cost becomes much higher because expensive material such as gold is used as the bonding wire.

SUMMARY OF THE INVENTION

It is therefore an object of this invention to provide small and inexpensive surface acoustic wave device by eliminating wire bonding in realizing electrical connection between electrodes of SAW devices and external circuits.

The present invention includes a configuration of SAW element and an improved SAW device with a surface mount package.

In detail, an input pad, an output pad, an earth pad are adherently attached on the surface of a surface mount package. One of SAW elements have an input electrode, an output electrode and an earth electrode adherently attached on one side. The input pad, the output pad and the earth pad are placed on the surface of the surface mount package so that they face the input electrode, the output electrode and the earth electrode, respectively. The SAW device according to the present invention includes a means that electrically connects the input pad, the output pad, and the earth pad with the input electrode, the output electrode and the earth electrode, respectively.

Therefore, in the present invention, when a signal of a designated frequency range is impressed between the input pad and the earth pad, the signal is impressed between the input electrode and the earth electrode through the connection. As the result, a surface acoustic wave is generated on the SAW element. The surface acoustic wave is received by the output electrode and an electric signal is generated between the output electrode and the earth electrode. The electric signal appears as a signal voltage between the output pad and the earth pad through the connecting means.

In the present invention, an electric signal is supplied to the SAW element and is extracted from the SAW element, without using wire bonding. Thus, a smaller device can be realized by reducing the area for wiring. Moreover, the manufacturing device can be made inexpensively because wire bonding that requires high accuracy is not necessary.

The present invention also relates to a manufacturing method of the above mentioned device. A face down bonding method is used in the present invention.

In the present invention, firstly, a metal bump is attached to a metal electrode of a SAW element. The metal bump contains the metallic component.

Secondly, a SAW element is placed on the pad forming area so that a metal electrode of the SAW element face the pad through the metal bump. The pad forming area is established on the upper surface of the base, and have a designated number of metal pads. When at least one of heat, pressure and supersonic wave are applied to the metal bump, the metal bump connects the pad and the electrode together. At the same time or later, a cover, a part of the surface mount package, is sealed with the base so that the SAW element stands between the cover and the pad forming surface.

In this way, with the method of the present invention a configuration of a SAW device where a metal bump is used as a connecting means is easily realized.

Here, if the metal component of the metal bump is gold, the stress generated at face down bonding, and applied to the electrode, the pad and the metal bump, can be reduced. The stress is generated due to the difference of coefficient of thermal expansion of the electrode and the pad, and the coefficient of thermal expansion of the metal bump. As the result, the increased quality of connectivity for the device is obtained.

A less expensive manufacturing of a device of the present invention is possible by mainly changing the structure of the pad forming surface.

If an earth pad is formed on large part of a pad forming surface, no exact positioning of an earth electrode and an earth pad is necessary, because at least part of the pad forming surface faces the SAW element. Strictly speaking, the earth pad is to be formed in the area other than the forming area of the input pad and the output pad, and the gap area along the border of the input pad and the output pad. As the result, lower positioning accuracy can be acceptable, which lowers the cost of the manufacturing device, and the manufacturing cost of the SAW device itself decreases.

The present invention can be realized as a structure with less discharge breakdown of electrodes. Discharge breakdown is a phenomenon where electrodes are destructed by discharging voltage generated at electrodes by temperature change. In the present invention, the discharge breakdown is prevented by using a high resistance pattern that connects either the input pad or the output pad, and the earth pad. By the high resistance pattern, the voltage generated at the electrodes are discharged and the discharge breakdown of the electrodes are avoided.

It is desirable that the high resistance pattern is made of material with lower electrical conductivity than the input pad and the output pad, which reduces the size of the high resistance pattern and contributes to the miniaturization of the device. Here, the high resistance pattern can be placed in the gap area.

Furthermore, the device of the present invention can have a function of the ability to match the impedance of the input or the output. In order to perform impedance matching, a reactance element must be placed between the input electrode and the earth electrode, or between the output electrode and the earth electrode. With the present invention, the reactance element can be placed on the package surface using the pad forming area. Strictly speaking, the reactance pattern as the reactance element is formed on the surface of the surface mount package. The reactance pattern has designated reactance value, and connects the earth pad with either the input pad or the output pad. As the result, an impedance matching circuit is formed on the input side or the output side of a SAW element. There can be more than one reactance pattern and the reactance can be either inductive or capacitive.

A surface mount package is originally divided into two parts: the one with a pad forming area and the one without a pad forming area. The surface mount package is then assembled from the two parts so that a SAW element is stored inside the package. The former is called the base and the latter is call the cover. With respect to the shape, the base can be a box and the cover can be a panel, or vice versa.

Furthermore, the accuracy of the placement of the SAW element inside a package can be increased using the base. If a SAW element is pressed toward the pad forming area by making a projection (or by other means), the placement accuracy along the pressing direction is ensured. The pressure makes the above mentioned electric connection more stable.

BRIEF DESCRIPTION OF THE DRAWINGS

The accompanying drawing and its description will facilitate an understanding of the invention. In this drawing, by way of illustration and not of limitation.

DESCRIPTION OF THE PREFERRED EMBODIMENTS

Preferred embodiments in accordance with the present invention are described.

Figure 1:
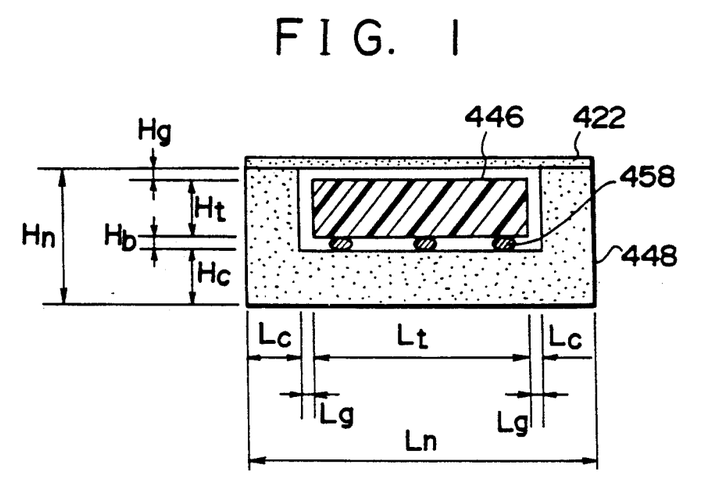
FIG. 1 is a cross-sectional view that shows a configuration of a SAW device that relates to the first embodiment in accordance with the present invention.

FIG. 1 describes an embodiment that relates to a SAW device in accordance to the present invention. The SAW device shown in the figure has a configuration where a SAW element 446 is stored in a package having a ceramics base 448 and a cover 442. This configuration is called a surface mount type.

The feature of the present embodiment is that on the surface of the base 448 there are pads which face electrodes of the SAW element 446. The feature is described in detail in FIG. 2, where the location of pads on the surface of the base 448 is shown.

Figure 2:
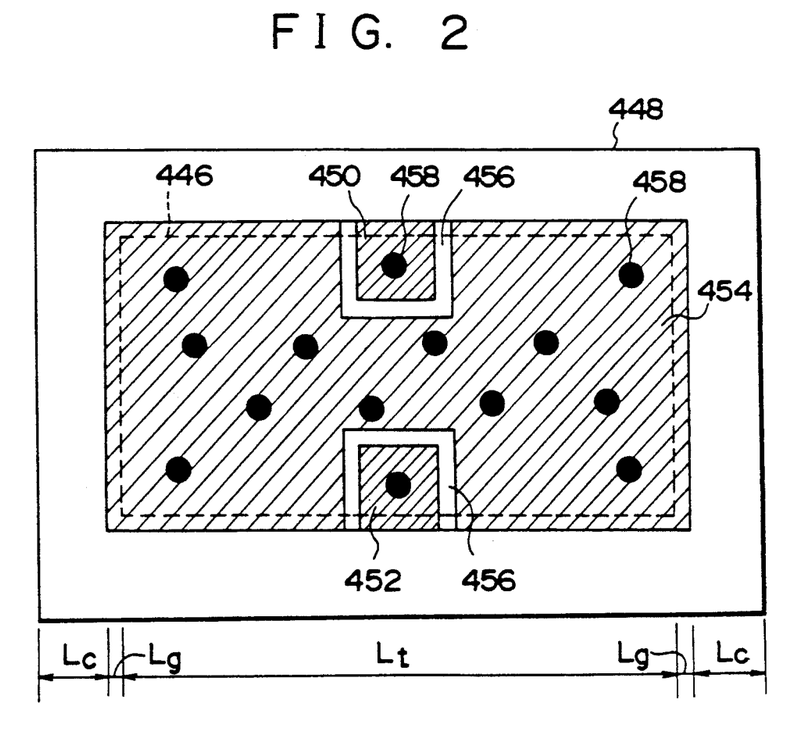
FIG. 2 is a plan view that describes the placement of a pad in the embodiment of FIG. 1.

In the figure, the base is viewed from the upper side of the FIG. 1 and the placement of the SAW element 446 is indicated by a broken line. The base 448 has a blind hole or storage area of rectangular shape where the SAW element 446 is stored. On the bottom surface of the hole, an input pad 450, an output pad 452 and an earth pad 454 are formed. The pads 450, 452, and 454 are made of conductive substance with designated electrical conductivity. There are gaps 456, 456 between the input pad 450 and the earth pad 454, and between the output pad 452 and the earth pad 454, that insulate pairs of the pads.

On the lower surface of the SAW element 446, gold bumps 458's are attached to the electrodes of the SAW element 446. The SAW element 446 is placed as indicated by the broken line in the figure. Connections between the pads 450, 452, 454 and the gold bumps 458's are established by pressure. This pressure is applied to the bumps 458's while warming up the bumps 458's or supplying a supersonic wave. In this way, the SAW device in accordance with the present embodiment is configured. In FIGS. 1 and 2, although the number of gold bumps 458 in FIG. 1 and FIG. 2 are different, this is because some of the gold bumps 458 are omitted in FIG. 1 for clarity.

In the embodiment, suppose that the SAW device has the outside dimension of $L_n$ (width) $\times H_n$ (thickness) and the SAW element 446 has the dimension of $L_t$ (width) $\times H_t$ (thickness). Then, the width $L_n$ of the SAW device is determined by the thickness $L_c$ of the inner wall of the base 448 and the distance $L_g$ between the inner wall of the base 448 and the SAW element 446. That is, $$L_n = L_t + 2(L_c + L_g)$$

On the other hand, the thickness $H_n$ of the SAW device is determined by the thickness of the bottom of the base 448, the height $H_b$ of the gold bump 458 when the SAW element 446 is fixed, the distance $H_g$ between the SAW element 446 and the cover 422. That is, $$H_n = H_t + H_c + H_b + H_g$$

According to these formulas, if $$L_c = 0.5 \text{ mm}$$

$$L_g = 0.1 \text{ mm}$$

$$H_c = 0.5 \text{ mm}$$

$$H_b = 0.1 \text{ mm}$$

$$H_g = 0.2 \text{ mm}$$

then, by assignment, the following equations holds:

$$L_n = L_t + 1.2 \text{ mm}$$

$$H_n = H_t + 0.8 \text{ mm}$$

where the values of $L_c$ and $H_c$ are the same as those of the second conventional embodiment, and $H_b$ and $H_g$ are calculated by experiences with conventional face down bonding. Therefore, compared with the second conventional embodiment, $L_n$ is smaller by 1.8 mm and $H_n$ is smaller by 0.7 mm.

As described above, a smaller device can be manufactured by placing electrodes of the SAW element 446, and pads (450, 452 and 454) of the base 448 in a facing position, which eliminates wire bonding that requires wiring space. Especially, for multiple electrode type SAW filters, it can be reduced the number of gold wires which are expensive and the cost is reduced significantly.

By using face down bonding techniques used in other field, manufacturing facilities can be adopted in the other field. Furthermore, the gold bump 458 decreases the stress due to the difference in coefficient of thermal expansion, which is generated by sudden change in temperature and can cause contact degradation. We can use a solden bubble as a bump for connecting a base and a SAW element, but the solden includes soldering flux. The flux deteriorates the transfer characteristics of the surface acoustic wave at the surface of the SAW element.

Since the earth pad 454 covers the bottom of the base 448 except for the neighborhood of the input pad 450 and the output pad 452, only the input and output electrodes need exact positioning. Thus, positioning method with lower accuracy can be used even for multiple electrode type SAW filters. Moreover, by adjusting the distance $L_g$ of the side wall of the base 448 and the SAW element 446, the positioning of the element 446 can be done using the base side wall as a guide, which can be done by a person without any aid of a machine. Therefore, the manufacturing cost of the SAW device can be lowered.

Figure 3:
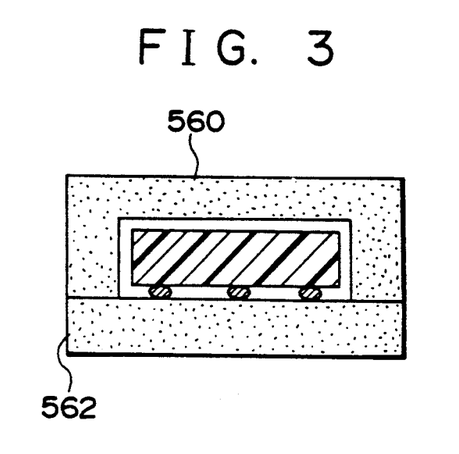
FIG. 3 is a cross-sectional view that shows a configuration of a SAW device that relates to the second embodiment in accordance with the present invention.

FIG. 3 is a cross-sectional view of the same type as the FIG. 1, that shows a configuration of the SAW device in accordance with the second embodiment of the present invention. In the embodiment, the cover 560 has a box-like shape and the base 562 is a plane. With this embodiment the same effect as the first embodiment can be obtained.

Figure 4:
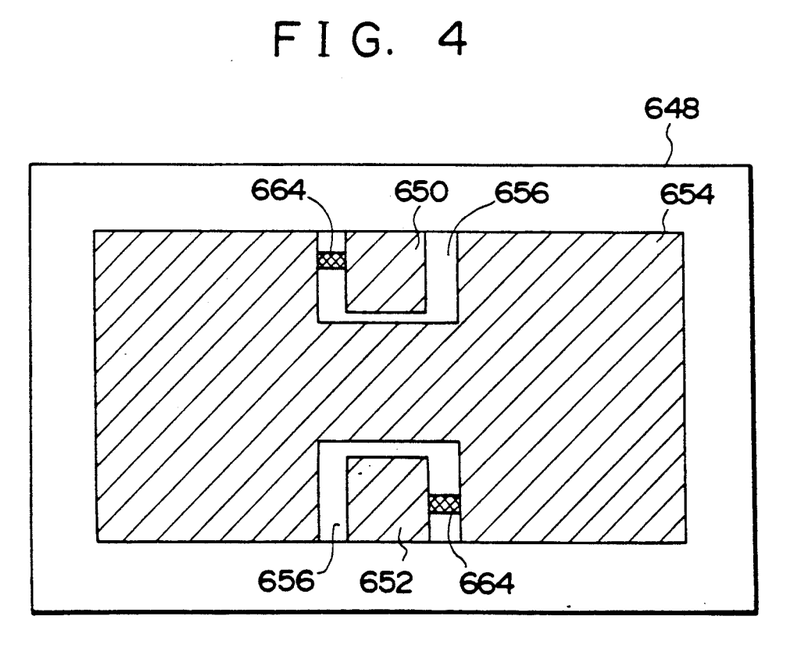
FIG. 4 is a plan view that shows a configuration of a SAW device that relates to the third embodiment in accordance with the present invention.

FIG. 4 shows a configuration of a SAW device, especially the upper surface of bottom of a base 648, in accordance with the third embodiment of the present invention, where the parts with the same configuration as the first embodiment are not shown. The only difference is that high resistance patterns 664, 664 are formed on gaps 656, 656 and they connect an input pad 650 with an earth pad 654, and an output pad 652 with the earth pad 654, respectively. The high resistance patterns 664, 664 are made of a material with lower electrical conductivity than the conductor material (conductor paste) that forms the pads 650, 652 and 654.

With the embodiment, discharge breakdown of electrodes are avoided. In general, electrodes of SAW devices have digits placed at a designated position, for example, in an interdigital position. With the embodiment, by the high resistance patterns 664, 664, the connection resistance between the pads are high and the voltage generated between the digits due to temperature change or the like can be discharged without degradation of the characteristics. Furthermore, external circuit conventionally used as resistance to avoid discharge breakdown becomes unnecessary. Discharge breakdown before the implementation of the circuit is avoided without external resistance. Furthermore, since the high resistance patterns 664, 664 are made of material with lower electrical conductivity than the pads 650, 652 and 654, it can be implemented with less area.

Figure 5:
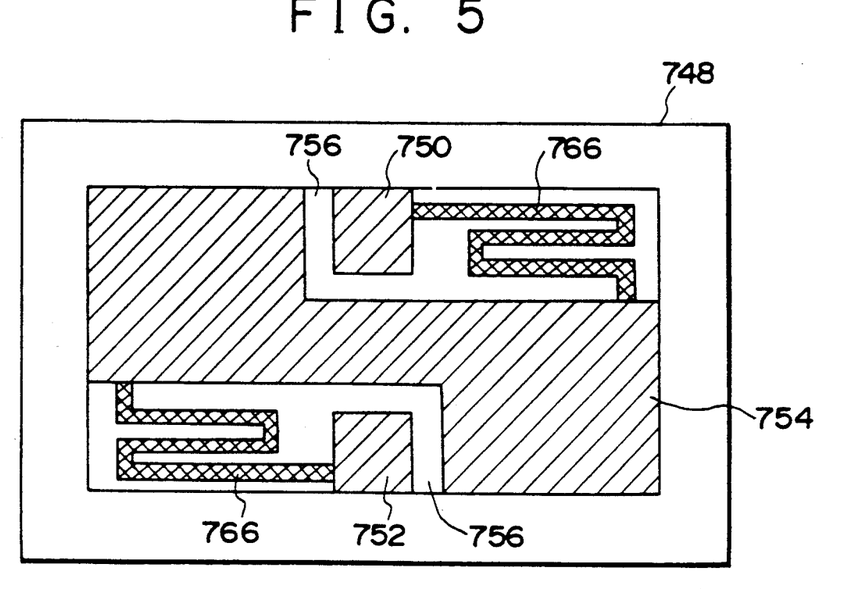
FIG. 5 is a plan view that shows a configuration of a SAW device that relates to the fourth embodiment in accordance with the present invention.

FIG. 5 shows a configuration of a SAW device, especially the upper surface of the bottom of a base 748, in accordance with the fourth embodiment of the present invention. This embodiment is also quite similar to the first embodiment, but inductances patterns 766, 766 connects an input pad 750 with an earth pad 754, and an output pad 752 with the earth pad 754.

Inductance patterns 776, 776 are formed on the surface of the base 748 (a part connecting with a gap 756) and have inductance that makes the input impedance and the output impedance match an external circuit. Therefore, matching can be done without using an external elements.

Figure 6:
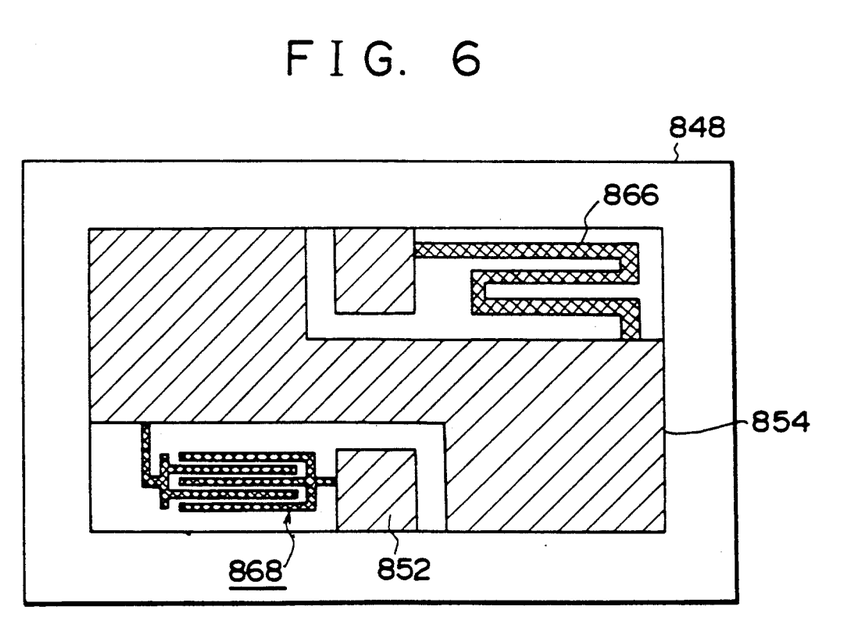
FIG. 6 is a plan view that shows a configuration of a SAW device that relates to the fifth embodiment in accordance with the present invention.

FIG. 6 shows a configuration of a SAW device, especially the upper surface of bottom of a base 848, in accordance with the fifth embodiment of the present invention. This embodiment is quite similar to the fourth embodiment and there is a capacitance pattern 868 between an output pad 852 and an earth pad 854. The capacitance pattern 868 with designated capacitance has interdigital shape and is formed on the surface of the base 848. Therefore, with this embodiment, the capacitance pattern 868 as well as the same inductance pattern as the fourth embodiment can be used for matching.

In the third, fourth, and fifth embodiments, a base with a hole is used, but a plane base used in the second embodiment can also be used.

Figure 7:
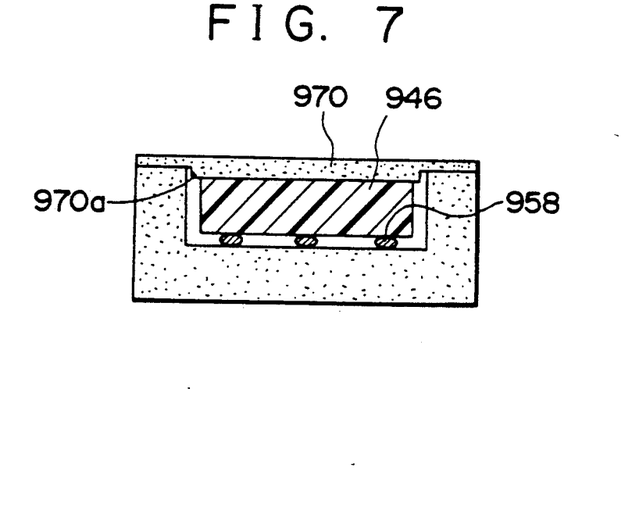
FIG. 7 is a cross-sectional view that shows a configuration of a SAW device that relates to the sixth embodiment in accordance with the present invention.

FIG. 7 shows a configuration of a SAW device, especially a cross-section of the device, in accordance with the sixth embodiment of the present invention. In the embodiment, a convex part 970a that presses a SAW element 946 downward is attached to the lower surface of the cover 970. With the configuration, the connection between electrodes and pads through a gold bump becomes more stable.

As so far described, with the present invention small and inexpensive SAW devices can be realized by the elimination of wire bonding, which is realized by placing each pad of a surface mount package in a facing position with each electrode of the SAW element.

Furthermore, since the face down bonding is used for the connection between electrodes of a SAW element and pads of surface mount package, techniques used in other fields can be easily adopted for manufacturing.

Additionally, since a bump contains gold, the stress caused by difference in coefficient of thermal expansion is decreased and the quality of the connection increases.

Furthermore, with an earth pad, lower accuracy in positioning can be acceptable, which reduces manufacturing cost of a device.

A high resistance pattern that connects pads with a high resistance discharges the voltage generated between electrodes by temperature change, and avoids discharge breakdown.

By setting the electrical conductivity of a high resistance pattern lower than the electrical conductivity of pads; the high resistance pattern can be smaller, which makes the size of a SAW device also smaller.

Pads are connected with a reactance pattern having designated inductance or capacitance, and the impedance of the input or the output can be matched within a SAW device.

The second part of the package presses a SAW element toward pads, and more stable connection between electrodes of a SAW element and pads of a package is obtained.

What is claimed is:

1. A surface acoustic device comprising:
    a surface acoustic wave element having an input electrode, an output electrode and an earth electrode, formed on one of the surfaces; when a signal of a designated frequency range is applied between the input electrode and the earth electrode, surface acoustic wave is generated; the surface acoustic wave is received by the output electrode and an electric signal is generated between the output electrode and the earth electrode;
    a surface mount package having an input pad, an output pad and an earth pad, formed on the surface, the input pad, the output pad and the earth pad are placed on the surface of the surface mount package so that they face the input electrode, the output electrode and the earth electrode, respectively, and wherein the earth pad is formed on a predetermined area of the surface of the surface mount package except gap areas, along the border of the input pad and the output pad;

a connection means that electrically connects the input pad, the output pad and the earth pad with the input electrode, the output electrode, and the earth electrode, respectively, said connecting means comprising metal bumps provided on said input electrode, output electrode and earth electrode for electrically connecting said pads and electrodes when at least one of heat, pressure and supersonic wave is applied to said metal bumps; and said surface mount package including positioning means for positioning the metal bumps formed on the input electrode, the output electrode and the earth electrode to the input pad, the output pad and the earth pad, respectively.

2. A surface acoustic wave device according to claim 1, wherein the surface acoustic wave device includes a designated number of reactance patterns that connects, with a designated resistance value, the earth pad with either the input pad or the output pad.

3. A surface acoustic wave device according to claim 2, wherein one of the reactance patterns is an inductance pattern that connects, with a designated inductance value, the earth pad with either the input pad or the output pad.

4. A surface acoustic wave device according to claim 2, wherein one of the reactance patterns is a capacitance pattern that connects, with a designated capacitance value, the earth pad with either the input pad or the output pad.

5. A surface acoustic wave device according to claim 2, wherein one of the reactance patterns is an inductance pattern that connects, with a designated inductance value, the earth pad with either the input pad or the output pad; and the other one of the reactance patterns is a capacitance pattern that connects, with a designated capacitance value, the earth pad with either the input or the output pad.

6. A surface acoustic wave device comprising:
a surface acoustic wave element having an input electrode, output electrode and an earth electrode, formed on one of the surfaces; when a signal of a designated frequency range is applied between the input electrode and the earth electrode, surface acoustic wave is generated; the surface acoustic wave is received by the output electrode and an electric signal is generated between the output electrode and the earth electrode;

a surface mount package having an input pad, an output pad and an earth pad, formed on the surface, the input pad, the output pad and the earth pad are placed on the surface of the surface mount package so that they face the input electrode, the output electrode and the earth electrode, respectively, and wherein the surface acoustic wave device includes a high resistance pattern that is formed on the surface on the surface of the surface mount package, and connects, with high resistance, the earth pad with either the input pad or the output pad for avoiding discharge breakdown of the electrodes;

a connection means that electrically connects the input pad, the output pad and the earth pad with the input electrode, the output electrode, and the earth electrode, respectively, said connecting means comprising metal bumps provided on said input electrode, output electrode and earth electrode for electrically connecting said pads and electrodes when at least one of heat, pressure and supersonic wave is applied to said metal bumps; and said surface mount package including positioning means for positioning the metal bumps formed on the input electrode, the output electrode and the earth electrode to the input pad, the output pad and the earth pad, respectively.

7. A surface acoustic wave device according to claim 6, wherein the electrical conductivity of a material forming the high resistance pattern is lower than the electrical conductivity of materials that form the input pad or the output pad.

8. A surface acoustic wave device comprising:
(a) a surface acoustic wave element having an input electrode, an output electrode and an earth electrode, formed on one of the surfaces; when a signal of a designated frequency range is applied between the input electrode and the earth electrode, surface acoustic wave is generated; the surface acoustic wave is received by the output electrode and an electric signal is generated between the output electrode and the earth electrode;
(b) a surface mount package having an input pad, and output pad, and an earth pad, formed on the surface; the input pad, the output pad and the earth pad are placed on the surface of the surface mount package so that they face the input electrode, the output electrode and the earth electrode, respectively;
(c) a connection means that electrically connects the input pad, the output pad and the earth pad with the input electrode, the output electrode and the earth electrode, respectively; and
(d) a high resistance pattern that is formed on the surface of the surface mount package, and connects, with high resistance, the earth pad with either the input pad or the output pad.

9. A surface acoustic wave device according to claim 8, wherein the electrical conductivity of a material forming the high resistance pattern is lower than the electrical conductivity of materials that form the input pad or the output pad.

10. A surface acoustic wave device comprising:
(a) a surface acoustic wave element having an input electrode, an output electrode and an earth electrode, formed on one of the surfaces; when a signal of a designated frequency range is applied between the input electrode and the earth electrode, surface acoustic wave is generated; the surface acoustic wave is received by the output electrode and an electric signal is generated between the output electrode and the earth electrode;
(b) a surface mount package having an input pad, an output pad and an earth pad, formed on the surface; the input pad, the output pad and the earth pad are placed on the surface mount package so that they face the input electrode, the output electrode and the earth electrode, respectively;
(c) a connection means that electrically connects the input pad, the output pad and the earth pad with the input electrode, the output electrode and the earth electrode, respectively; and (d) a designated number of reactance patterns that connects, with a designated reactance value, the earth pad with the either the input pad or the output pad.

11. A surface acoustic wave device according to claim 10, wherein one of the reactance patterns is an inductance pattern that connects, with a designated inductance value, the earth pad with either the input pad or the output pad.

12. A surface acoustic wave device according to claim 10, wherein one of the reactance patterns is a capacitance pattern that connects, with a designated capacitance value, the earth pad with either the input pad or the output pad.

13. A surface acoustic wave device according to claim 10, wherein one of the reactance patterns is an inductance pattern that connects, with a designated inductance value, the earth pad with either the input pad or the output pad; and the other one of the reactance patterns is a capacitance pattern that connects, with a designated capacitance value, the earth pad with either the input pad or the output pad.

14. A surface wave acoustic device comprising:

(a) a surface acoustic wave element having an input electrode, an output electrode and an earth electrode, formed on one of the surfaces; when a signal of a designated frequency range is applied between the input electrode and the earth electrode, surface acoustic wave is generated; the surface acoustic wave is received by the output electrode and an electric signal is generated between the output electrode and the earth electrode;

(b) a surface mount package having an input pad, an output pad and an earth pad, formed on the surface; the input pad, the output pad and the earth pad are placed on the surface of the surface mount package so that they face the input electrode, the output electrode and the earth electrode, respectively;

(c) a connection means that electrically connects the input pad, the output pad and the earth pad with the input electrode, the output electrode, and the earth electrode, respectively; and (d) a high resistance pattern that is formed on the surface of the surface mount package and connects, with high resistance, the earth pad with either the input pad or the output pad, for avoiding discharge breakdown of the electrodes.

15. A surface acoustic device according to claim 14 wherein the electrical conductivity of a material formed in the high resistance pattern is lower than the electrical conductivity of materials that form the input pad or the output pad.

16. A surface acoustic wave device according to claim 14, wherein the earth pad is formed on a predetermined area of the surface mount package except gap areas, along the border of the input pad and the output pad.

* * * * *